United States Patent [19]
Kikuchi et al.

[11] Patent Number: 6,033,728
[45] Date of Patent: *Mar. 7, 2000

[54] APPARATUS FOR SPIN COATING, A METHOD FOR SPIN COATING AND A METHOD FOR MANUFACTURING SEMICONDUCTOR DEVICE

[75] Inventors: Kenji Kikuchi; Tomoaki Muramatsu, both of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/625,675

[22] Filed: Apr. 3, 1996

Related U.S. Application Data

[62] Division of application No. 08/452,956, May 30, 1995, abandoned, which is a continuation of application No. 08/241,562, May 12, 1994, abandoned.

[30] Foreign Application Priority Data

May 13, 1993 [JP] Japan ................................. 5-111749

[51] Int. Cl.$^7$ .......................... B05D 3/12; H01L 21/469
[52] U.S. Cl. .................. 427/240; 427/299; 438/782; 438/780
[58] Field of Search .................... 118/695, 700, 118/706, 52; 427/240, 498, 512, 307, 299; 437/228, 231; 134/1.3, 34, 36; 438/763, 778, 780, 782

[56] References Cited

U.S. PATENT DOCUMENTS

| | | | |
|---|---|---|---|
| 4,393,807 | 7/1983 | Fujimura | 118/52 |
| 4,510,176 | 4/1985 | Cuthbert et al. | 118/52 |
| 4,564,280 | 1/1986 | Fukuda | 118/52 |
| 4,668,334 | 5/1987 | Doornveld | 118/52 |
| 4,685,975 | 8/1987 | Kottman et al. | 427/273 |

(List continued on next page.)

FOREIGN PATENT DOCUMENTS

| | | |
|---|---|---|
| 0 183 297 | 6/1986 | European Pat. Off. . |
| 0 403 086 | 12/1990 | European Pat. Off. . |
| 58-97835 | 7/1983 | Japan . |
| 60-138925 | 7/1985 | Japan . |
| 61-15773 | 1/1986 | Japan . |
| 61-150332 | 7/1986 | Japan . |
| 61-238050 | 10/1986 | Japan . |
| 62-117321 | 5/1987 | Japan . |
| 63-148633 | 6/1988 | Japan . |
| 1-58375 | 3/1989 | Japan . |
| 2-133916 | 5/1990 | Japan . |
| 2-73727 | 6/1990 | Japan . |
| 3-252124 | 11/1991 | Japan . |
| 4-98823 | 3/1992 | Japan . |
| 4-300674 | 10/1992 | Japan . |
| 4-305270 | 10/1992 | Japan . |

OTHER PUBLICATIONS

Search Report for G.B application 9,409,655.9.

Japanese Abstract of patent No. 3–76109 of Apr. 1991 by Toshiro Tsumori vol. 52 E 1080.

*Primary Examiner*—Marianne Padgett
*Attorney, Agent, or Firm*—Armstrong, Westerman, Hattori, McLeland & Naughton

[57] ABSTRACT

The invention relates to an apparatus for spin coating for forming a resist film, an SOG film, a polyimide film, and the like in manufacturing semiconductor devices and has the object of forming a coated film with a specified and uniform thickness even in case that an amount of discharged coating solution is a little. An apparatus for spin coating of the invention comprises a rotatable table for placing a wafer, a coating solution discharging means which is set above the rotatable table and discharges a coating solution on the surface of the wafer, and a solvent discharging means which is above the rotatable table and discharges a solvent capable of dissolving the coating solution.

5 Claims, 10 Drawing Sheets

U.S. PATENT DOCUMENTS

| | | | |
|---|---|---|---|
| 4,688,918 | 8/1987 | Suzuki et al. | 118/52 |
| 4,850,299 | 7/1989 | Merullo et al. | 118/52 |
| 4,982,694 | 1/1991 | Moriyama | 118/52 |
| 4,989,345 | 2/1991 | Gill, Jr. | 118/52 |
| 5,089,305 | 2/1992 | Ushijima et al. | 118/52 |
| 5,094,884 | 3/1992 | Hillman et al. | 118/52 |
| 5,127,362 | 7/1992 | Iwatsu et al. | 118/52 |
| 5,250,114 | 10/1993 | Konishi et al. | 118/52 |
| 5,366,757 | 11/1994 | Lin | 118/52 |
| 5,646,071 | 7/1997 | Lin et al. | 438/763 |
| 5,658,615 | 8/1997 | Hasebe et al. | 427/240 |
| 5,688,555 | 11/1997 | Teng | 427/240 |
| 5,705,223 | 1/1998 | Bunkofske | 427/240 |
| 5,780,105 | 7/1998 | Wang | 427/240 |
| 5,874,202 | 2/1999 | Ortho | 427/240 |
| 5,902,399 | 5/1999 | Courtenay | 427/240 |
| 5,939,139 | 8/1999 | Fujimoto | 427/240 |
| 5,940,651 | 8/1999 | Pike et al. | 427/240 |

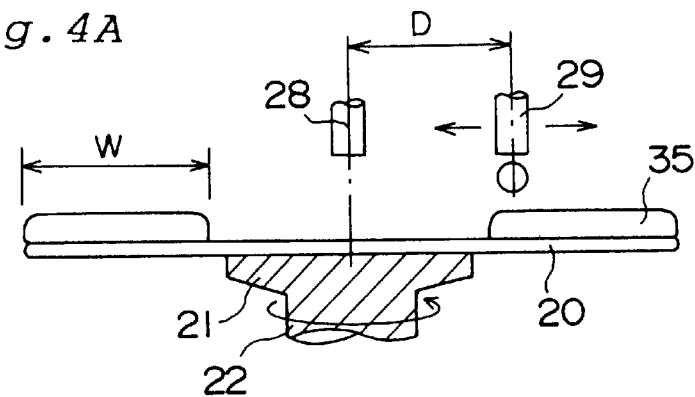
Fig. 4A
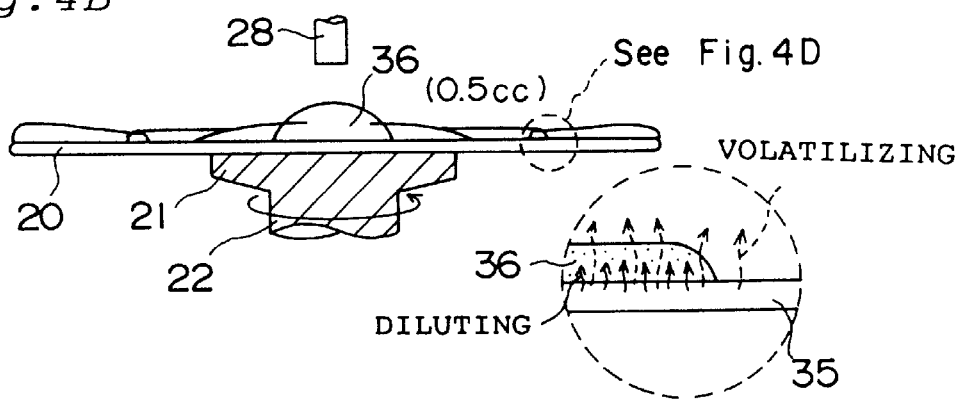
Fig. 4B
Fig. 4D
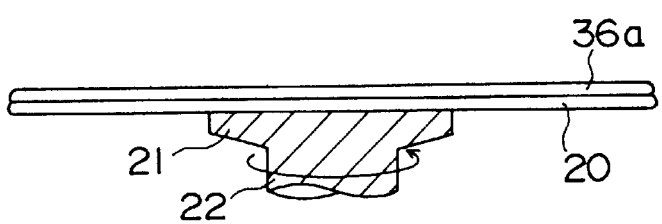
Fig. 4C

SOLVENT DRIPPING

RESIST DRIPPING AND PRESPINNIG

HIGH SPEED SPINNING

TIME

APPARATUS FOR SPIN COATING, A METHOD FOR SPIN COATING AND A METHOD FOR MANUFACTURING SEMICONDUCTOR DEVICE

This application is a divisional of application Ser. No. 08/452,956 filed May 30, 1995, abandoned, which is a Continuation of application Ser. No. 08/241,562, filed May 12, 1994, abandoned.

BACKGROUND OF THE INVENTION

1. Field of the Invention

The present invention relates to an apparatus for spin coating and a method for spin coating, and more particularly to an apparatus for spin coating and a method for spin coating which are used for forming a resist film, an SOG (spin-on-glass) film, a polyimide film, and the like in manufacturing semiconductor devices.

In manufacturing a semiconductor device, a photoresist film is formed as an etching resistant mask to be used in patterning an insulating film and a conductive film, and an SOG film is formed as an interlayer in a tri-layer resist system, and furthermore a polyimide film is formed as a covering insulating film.

These various films are often formed by spin coating and it is desired for them to be made uniform in thickness. As for a photoresist film used as an etching resistant film and an SOG film as an interlayer in a tri-layer resist system, in particular, it is necessary to make them thin and uniform in thickness in case of forming a fine pattern. Therefore, it is desired to further improve an apparatus for spin coating and a method for spin coating.

2. Description of the Prior Art

FIG. 1A is a schematic diagram showing an apparatus for spin coating of resist films according to the prior art.

In FIG. 1A, reference number 1 is a disk-shaped rotatable table for placing a wafer, and the rotatable table 1 is supported by a rotating shaft 2 which is fixed perpendicularly to the wafer placing face of the rotatable table 1 and is connected with a spinning motor 3, so that the wafer placing face may be turned on the rotating shaft 2 by the spinning motor 3. The rotatable table 1 has an unshown suction port in the wafer placing face for fixing a wafer 11 by suction.

Reference number 4 is a process cup set around the rotatable table 1. In the bottom of this process cup 4 are formed an exhaust port 5 for exhausting extra resist which is scattered when applying the resist to the wafer 11, an air current regulating plate 6 which regulates an air current in the process cup 4 in order to form a resist film with uniform thickness by adjusting evaporation of a solvent contained in the resist, and an exhaust port 7 connected with an unshown exhauster.

Reference number 8 is a discharge nozzle, which is connected with a discharge mechanism part 10 through a pipe 9. By means of them, a certain amount of resist solution is fed to the discharge nozzle 8 and discharged on the center part of the surface of the wafer 11.

A method for forming a resist film on the wafer 11 by means of the spin coating apparatus is described in the following with reference to FIGS. 1A and 1B. FIG. 1B is a timing chart showing a process sequence.

First, the wafer 11 is fixed on the rotatable table 1 by suction, and then the inside of the process cup 4 is exhausted through the exhaust port 7 and an air current in the process cup 4 is regulated with the air current regulator plate 6 as an auxiliary means.

Next, after discharging a resist solution of 2 to 3 cc from the resist discharge nozzle 8 on the center part of the wafer 11, the rotatable table 1 is rotated with the spin motor 3. In this case, the resist solution is spread from the center part to the fringe part of the wafer 11 by the centrifugal force. Then, when a rotating speed is increased, the resist solution is spread wider on the wafer 11 by the greater centrifugal force so that the resist solution layer may become thinner and at the same time a solvent in the resist solution is evaporated to form a resist film. This two steps manner of the rotating speed reduces an ununiformity in thickness of the resist film which may be caused in case of an abrupt acceleration at the time of discharging the resist.

When the rotatable table 1 is stopped after a specified period, a resist film of uniform thickness has been formed on the wafer 11 as shown in FIG. 2A.

By the way, in the above-mentioned coating method, since the resist is coated by rotating the wafer 11a, a resist solution is not only spread over the surface of the wafer 11 to the fringe part of it but also scattered from the surface of the wafer 11 by the centrifugal force. For example, an amount of the scattered resist reaches the level of 90% of the whole amount. This is wasteful since the scattered resist cannot be reused.

Further, since a photoresist film may be formed as evaporating a solvent in the resist solution, a state of the coated resist solution, namely, a thickness of the photoresist film varies with the following conditions, 1. The start-up acceleration of the spin motor 3 immediately after discharging the resist, a rotating speed of it, and a rotating period of it
2. An exhausting speed of the air while spin coating, and
3. Ambient temperature, humidity, and the like around each part.

In case of discharging a little amount of resist solution in order to reduce the cost, both scattering of the resist from the surface of the wafer 11 and evaporation of a solvent in the resist solution come to an end before the resist solution reaches thoroughly from the center part to the fringe part of the wafer 11.

Accordingly, the formed photoresist film is not uniform in thickness and the photoresist film cannot reach a specified value in thickness on the fringe part of the wafer 11. Thus there is a problem that a patterned photoresist film formed by exposing and developing the photoresist film varies in a pattern size.

Further, there is also a problem that in an extreme case it is impossible to form a pattern of the photoresist film in the fringe part of the wafer 11 since an area uncovered with photoresist film 12 exists in the fringe part of the surface of the wafer 11. Moreover, in case of reducing content of base polymer in the resist solution by increasing an amount of solvent in order to keep the resist solution in a fluid state for a long time, the formed photoresist film becomes 0.6 μm in thickness which is about half of a specified thickness and as a result a specified film thickness cannot be obtained.

SUMMARY OF THE INVENTION

It is an object of the present invention to provide an apparatus for spin coating and a method for spin coating capable of forming a coated film with a specified and uniform thickness even in case of reducing a consumption of the coating solution.

An apparatus for spin coating of the invention has a coating solution discharging means which is set above the rotatable table for placing a wafer and discharges a coating solution on the surface of the wafer and a solvent discharging means which is set above the rotatable table and discharges a solvent on the surface of the wafer.

Thus, as shown in a method for spin coating of the invention, a solvent may be discharged on the fringe part of the surface of the wafer in advance, covers the fringe part of the surface of the wafer with a proper amount of solvent by spreading the solvent over the fringe part of the wafer, a coating solution containing the solvent may be discharged on the center part of the wafer and the wafer is turned.

Thereby, the coating solution reaches the area covered with the solvent of the fringe part of the surface of the wafer, is mixed with the solvent on the fringe part, and is dissolved in the solvent. Although the coating solution is slightly increased in viscosity since the solvent in the coating solution is evaporated by the time when the coating solution reaches the area covered with the solvent, the coating solution spreads wider to the fringe part since it is decreased again in viscosity by being diluted with the solvent existing on the fringe part.

In this manner, since an sufficient amount of coating solution is uniformly supplied to the fringe part of the wafer, even in case that a solvent is easy to dry and an amount of discharged coating solution is a little, a coated film, for example, a resist film, an SOG film, or a polyimide film which has a specified and uniform thickness can be formed on the wafer.

Besides, the invention is not limited to the center part of the wafer in discharging the resist solution and the fringe part of the wafer in discharging the solvent.

And by disposing a solvent discharging means together with a coating solution discharging means above the center part of the surface of the wafer and previously discharging a solvent on the center part of wafer to cover the surface of the wafer with a solvent in advance, it is possible to improve fluidity of a coating solution supplied later and spread a little amount of coating solution all over the wafer. In this way, it is possible to reduce consumption of a coating solution for obtaining a specified film thickness.

Furthermore, by being provided with a moving means for moving a solvent discharging means, it is possible to set the solvent discharging means at a proper location above the fringe part of the surface of the wafer in consistence with a kind and viscosity of each of a coating solution and solvent, an volatilizing rate of the solvent, the diameter of a wafer, an ambient temperature around the rotatable table, and the like. Therefore, a proper amount of solvent is remained over a proper area from a proper location in the fringe part on the surface of the wafer. In this manner, since a coating solution surely reaches an area covered with a solvent in the fringe part and is readjusted to be proper in viscosity, a coated film which is uniform in thickness between the center part and the fringe part of the wafer can be formed.

Still further, an apparatus of the invention is provided with a control means which sends control signals to a rotating means, a coating solution discharging means, a solvent discharging means, and a moving means and controls a working time, a working period, and a rotating speed of the rotating means and a working time, a working period, and a moving distance of the moving means, and controls a discharging time, a discharging period, and a discharge amount of a coating solution and a solvent respectively discharged from the coating solution discharging means and the solvent discharging means.

Accordingly, the apparatus can automatically set conditions for forming a coated film of a specified and uniform thickness with the least amount of coating solution by inputting in advance into the control means such information as a kind and viscosity of each of the coating solution and solvent, an evaporating rate of the solvent, the diameter of a wafer, an ambient temperature around the wafer placing table, and the like, and can automatically operate the rotating means, the coating solution discharging means, the solvent discharging means, and the moving means according to the set conditions.

BRIEF DESCRIPTION OF THE DRAWINGS

FIGS. 4A, 4B, 4C and 4D are cross-sectional views showing a static-dripping method for spin coating by means of an apparatus for spin coating of an embodiment of the invention.

DESCRIPTION OF THE PREFERRED EMBODIMENT OF THE INVENTION

An embodiment of the invention is described hereinafter with reference to the drawings.

(1) An Apparatus for Spin Coating

Figure 3:
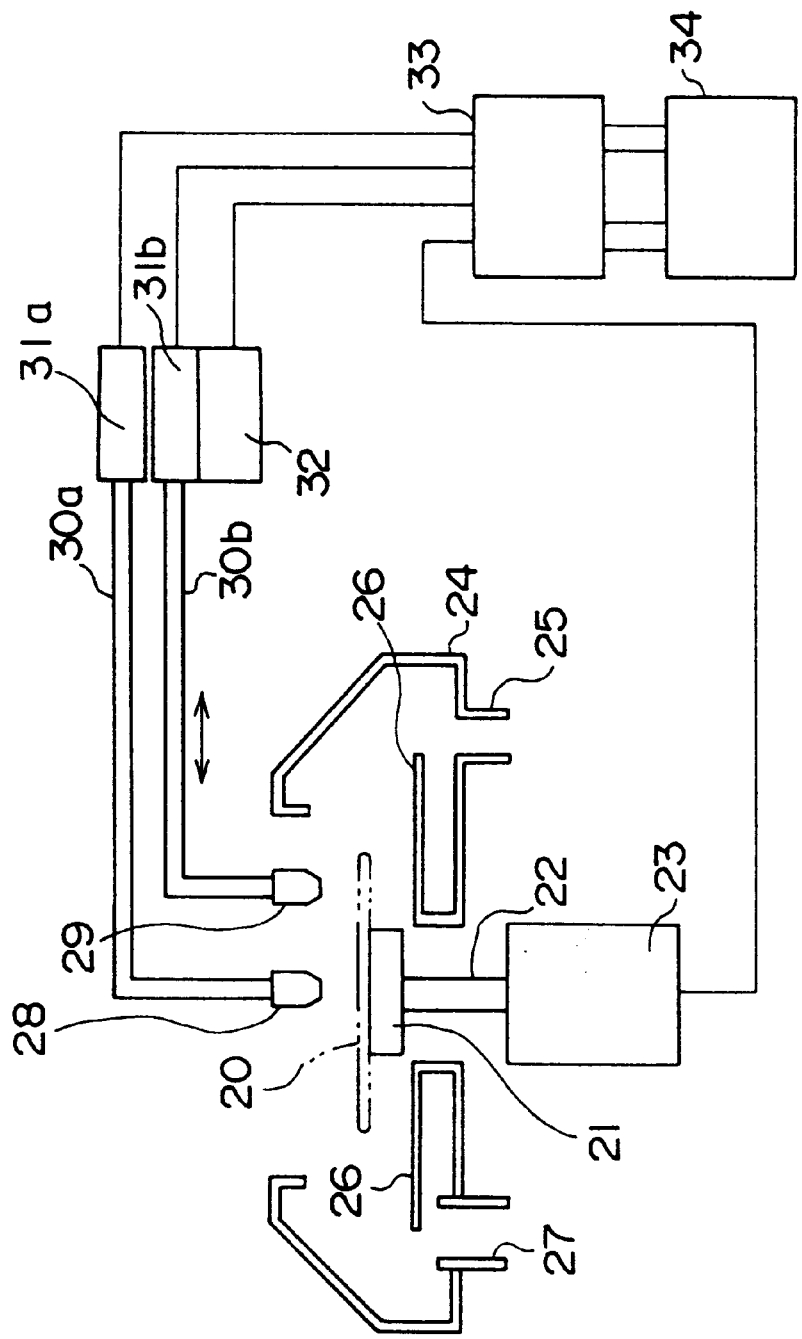
FIG. 3 is a schematic diagram showing an apparatus for spin coating of an embodiment of the invention.

FIG. 3 is a schematic diagram showing an apparatus for spin coating according to an embodiment of the invention.

In FIG. 3, reference number 21 is a disk-shaped rotatable table for placing a wafer, and the rotatable table 21 is supported with a turning shaft 22 which is fixed to the rotatable table 21 perpendicularly to the wafer placing face of it and is connected with a spinning motor (a turning means) 23, so that the wafer placing face may be turned on the turning shaft 22 with the spinning motor 23 in a plane perpendicular to the turning shaft 22. The rotatable table 21 has an unshown suction port in the wafer placing face for fixing a wafer 20 on the rotatable table 21 by suction.

Reference number 24 is a process cup set around the rotatable table 21. In the bottom part of the process cup 24 are formed an exhaust port 25 for exhausting an extra resist solution (a coating solution) which is scattered when applying the resist solution to the wafer 20, an air current regulator plate 26 which regulates an air current in the process cup 4 in order to form a resist film with uniform thickness by adjusting evaporation of a volatile solvent, for example, an ethyl lactate solvent contained in the resist solution, and an exhaust port 27 connected with an unshown exhauster.

Reference number 28 is a resist solution discharge nozzle, which is connected with a discharge mechanism part 31a through a pipe 30a. By means of them, a certain amount of resist solution is fed to the resist solution discharge nozzle 28 and discharged on the wafer 20. And reference number 29 is a solvent discharge nozzle, which is connected with a discharge mechanism part 31b through a pipe 30b. By means of them, a certain amount of ethyl lactate solvent is fed to the solvent discharge nozzle 29 and discharged on the wafer 20. Furthermore, reference number 32 is a moving means such as a motor for straightly reciprocating the solvent discharge nozzle 29 in the horizontal direction.

Reference number 33 is a control means which sends control signals to a spinning motor 23, discharge mechanism parts 31a and 31b, and a moving means 32 to control a working time, a working period, and a rotating speed of the spinning motor 23 and control a working time, a working period, and a moving distance of the moving means 32, and control a discharging time, a discharging period, and a discharge amount of a resist solution and a solvent respectively discharged from a resist solution discharge nozzle 28 and a solvent discharge nozzle 29.

Reference number 34 is an input means for inputting in advance into the control means 33 such information as a kind and viscosity of each of the resist solution and solvent, an evaporating rate of the solvent, the diameter of a wafer 20, an ambient temperature around the rotatable table 21, and the like.

There is the following relation between each information and each control item. For example, a working time and rotating speed of the spinning motor 23, and a discharging period of the resist solution and the solvent, and the like are determined according to a kind or viscosity of resist solution and solvent, an evaporating rate of the solvent, and an ambient temperature around the rotatable table 21. Thus a residual amount and viscosity of the solvent on the fringe part of the wafer 20, and a final thickness of a photoresist film are settled.

Furthermore, a moving distance of the moving means 32 and the like are determined according to a kind and viscosity of resist solution and solvent and the diameter of the wafer 20 and an area to be covered with the solvent in the fringe part of the wafer 20 is settled in location and range.

Still further, a working time of the spinning motor 23, a working time of the moving means 32, and a discharging period of the resist solution and the solvent, and the like are determined according to whether a static-dripping method for spin coating is used or a dynamic-dripping method for spin coating is used. In the above description, a static-dripping method for spin coating is a method in which a resist solution is dripped when the rotatable table 21 is at a standstill. A dynamic-dripping method for spin coating is a method in which a resist solution is dripped when the rotatable table 21 is being rotated.

Accordingly, by inputting in advance into the control means 33 such information as a kind and viscosity of each of the resist solution and solvent, an evaporating rate of the solvent, the diameter of a wafer 20, an ambient temperature around the rotatable table 21, and the like, the apparatus can automatically set conditions for forming a coated film of uniform thickness with the least amount of coating solution and can also automatically operate the turning means 23, the discharge mechanism parts 31a and 31b, and the moving means 32 in basis of these set conditions.

As mentioned above, the apparatus according to the embodiment of the invention has a resist solution discharge nozzle 28 which is set above the center part of the surface of a wafer 20 on a rotatable table 21 and discharges a resist solution or the like and a solvent discharge nozzle 29 which can be moved in the horizontal direction above the surface of the wafer 20 and discharges on the fringe part of the wafer 20 an ethyl lactate solvent which is same kind of a solvent contained in the resist solution.

Therefore, when discharging a resist solution on the center part of the wafer 20 after discharging an ethyl lactate solvent on the fringe part of the surface of the wafer 20 and covering the fringe part of the wafer 20 with a proper amount of ethyl lactate solvent by spreading the ethyl lactate solvent in advance through turning the wafer 20 and before the ethyl lactate solvent is dried, the resist solution is spread outward by rotation of the wafer 20 and reaches the area covered with the solvent on the fringe part of the surface of the wafer 20 and the resist solution is mixed with the ethyl lactate solvent on the fringe part and is dissolved in the ethyl lactate solvent.

Although the resist solution is slightly increased in viscosity since the ethyl lactate solvent in the resist solution is evaporated by the time when the resist solution reaches the area covered with the solvent, the resist solution is uniformly spread wider to the fringe part since it is decreased in viscosity by being diluted with the ethyl lactate solvent supplied on the fringe part.

In this manner, since a sufficient amount of resist solution is uniformly supplied to the fringe part of the wafer 20 even in case that the ethyl lactate solvent is easy to dry and an amount of discharged resist solution is a little, a resist film with a specified and uniform thickness can be formed on the wafer 20.

And, by being provided with a moving means 32 for moving a solvent discharging means 29, it is possible to set the solvent discharging means 29 at a proper location above the fringe part of the surface of the wafer 20 as considering viscosity of each of a resist solution and an ethyl lactate solvent, an evaporating rate of the ethyl lactate solvent, the diameter of the wafer 20, an ambient temperature around the rotatable table 21, and the like.

Therefore, a proper amount of ethyl lactate solvent is remained over a proper area from a proper location in the fringe part on the surface of the wafer 20. In this manner, since a resist solution surely reaches an area covered with the ethyl lactate solvent in the fringe part and is readjusted to be proper in viscosity, a photoresist film which is uniform in thickness between the center part and the fringe part of the wafer 20 can be formed.

Furthermore, by being provided with a moving means 32, a control means 33, and an input means 34, the conditions for operation are automatically set and the spin motor 23 and the like are automatically operated and stopped.

Though the spin coating apparatus of the embodiment is provided with a moving means 32, a control means 33, and an input means 34, these means are not necessary. Namely, by manually adjusting in advance a location of the solvent discharge nozzle 29, an amount of solvent to be discharged, a rotating speed of the spin motor 23, and the like in response to change of such conditions as kinds and viscosity of the resist solution and the solvent to be used and the diameter of the wafer 20, a resist film with a specified and uniform thickness can be formed on the wafer 20 even in case that an amount of discharged resist solution is a little. The invention can be applied to not only a spin coating apparatus for a resist solution but also an apparatus for coating an SOG solution or a polyimide solution by spinning.

Still further, in the embodiment, ethyl lactate is used for both of a solvent in the resist solution and a solvent to be discharged from the solvent discharge nozzle 29. But another kind of solvent may be used, or solvents which are different from each other in both solvents may be used.

(2) Method for Spin Coating

A method for spin coating according to an embodiment of the invention for forming a resist film on a wafer by means of the above-mentioned spin coating apparatus is described hereinafter with reference to FIGS. 3, 4A to 4C, and 5.

Figure 5:
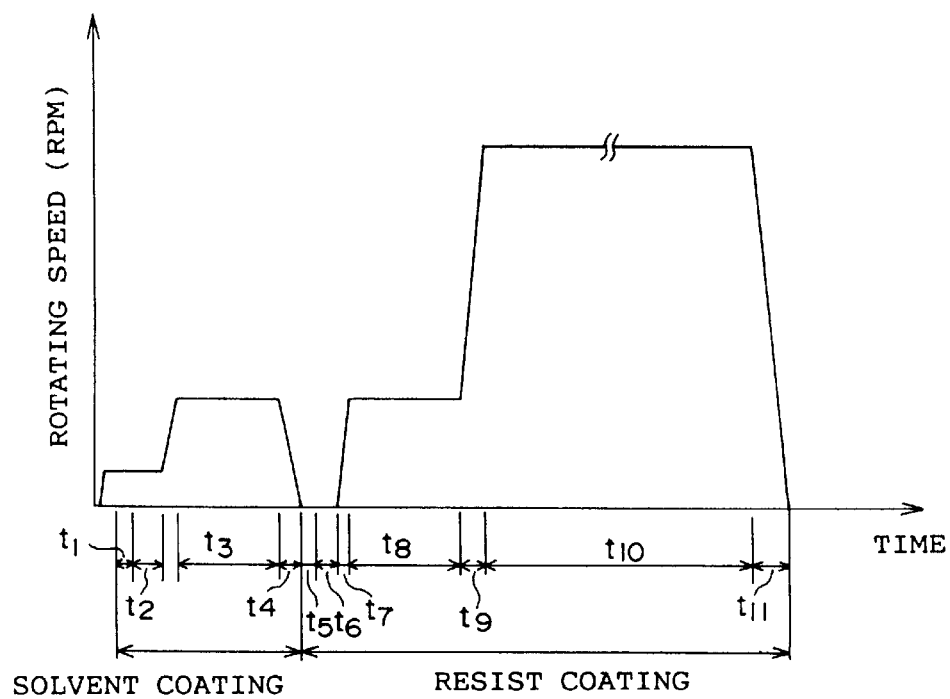
FIG. 5 is a timing chart for explaining a static-dripping method for spin coating by means of an apparatus for spin coating of an embodiment of the invention.

FIGS. 4A to 4C are cross-sectional views showing a state of a solvent and a coating solution on the surface of a wafer and FIG. 5 is a timing chart showing a process sequence, and as an example they show a static-dripping method for spin coating in which a resist solution is dripped when the wafer is rest. In this embodiment, t8=0, namely, a rotating speed of the wafer is increased to the final rotating speed without a prespinning period, immediately after dripping the resist solution. In this case, a wafer of 6 inches in diameter is used as the wafer 20.

First, such information as a kind and viscosity of a resist solution and a solvent, an evaporating rate of the solvent, the diameter of the wafer, and an ambient temperature around the rotatable table 21 are inputted in advance into the control means 33 through the input means 34. Thus, according to a kind and viscosity of each of the resist solution and solvent, an evaporating rate of the solvent, and an ambient temperature around the rotatable table 21, a working time and a rotating speed of the spinning motor 23, and a discharging period of the resist solution and the solvent, and the like are determined. Thus a residual amount and viscosity of the solvent of the resist solution on the fringe part of the wafer 20, and a final resist film thickness are settled.

And, according to a kind and viscosity of the resist solution and the diameter of the wafer 20, a moving distance of the moving means 32 and the like are determined and an area to be covered with the solvent in the fringe part of the wafer 20 is settled in location and range.

Furthermore, since a static-dripping method for spin coating is used in this case, according to the timing chart shown in FIG. 5 a working time of the spinning motor 23, a working time of the moving means 32, a discharging period of the resist solution and the solvent, and the like are determined.

Next, as shown in FIG. 3, the wafer 20 is fixed on the rotatable table 21 by suction. Then, the inside of the process cup 24 is exhausted through the exhaust port 27, and then the air current inside the process cup 24 is adjusted through the air current regulator plate 26. An ambient temperature around the rotatable table 21 is kept constant at 23 C.

Next, the wafer placing table 21 is turned with the spin motor 23 at a low rotating speed of 240 rpm. Then, after the same kind of ethyl lactate (solvent) as the volatile ethyl lactate (solvent) contained in the resist solution is discharged by about 2 cc on the fringe part 25 mm inside from the edge of the wafer 20 through the solvent discharge nozzle 29 (t1 in FIG. 3), this state is kept for 1 second (t2 in FIG. 3). By this, as shown in FIG. 4A, the ethyl lactate solvent 35 is spread in a shape of belt in the fringe part on the surface of the wafer 20 by the centrifugal force.

Next, the rotatable table 21 is turned at a rotating speed of 1000 rpm by increasing the rotating speed of the spin motor 23, and this state is maintained for a specified period (t3 in FIG. 3). By this, while the ethyl lactate solvent 35 is spread wider from the center part to the fringe part of the wafer 20, volatilization of the solvent 35 progresses and an amount of ethyl lactate solvent remained on the surface of the wafer 20 becomes so proper that the resist film may reach a target value in thickness and may have the minimum variation in thickness.

Next, the spin motor 23 is stopped (t4 in FIG. 5) and the resist solution 36 of about 0.5 cc is discharged on the center part of the surface of the wafer 20 through the resist solution discharge nozzle 28 (t5 in FIG. 5) before the ethyl lactate solvent is removed by volatilization, namely, immediately after the spin motor 23 is stopped.

After about 1 second passes (t6 in FIG. 5), the spin motor 23 is started again to turn at an acceleration of 10000 rpm and when the rotating speed reaches 3560 rpm (t7 to t9 in FIG. 5), the rotatable table 21 is kept turning at this rotating speed. As shown in FIG. 4B, immediately after the wafer 20 is started to turn, the discharged resist solution 36 is spread from the center part to the fringe part of the wafer 20 by the centrifugal force and reaches an area covered with the solvent. Although the resist solution 36 is slightly increased in viscosity since the ethyl lactate solvent 35 in the resist solution 36 is volatilized by the time when the resist solution 36 reaches the area covered with the solvent, the resist solution 36 is spread wider toward the fringe part since the resist solution 36 is decreased in viscosity by being diluted with the ethyl lactate solvent 35. And the ethyl lactate solvent 35 proceeds in volatilization.

As shown in FIG. 5, a prespinning period (t8 in FIG. 5) in which the spin motor 23 is kept turning at a rotating speed of 1000 rpm for a few seconds may be provided before the resist spreading period (t10 in FIG. 5). Variation in thickness of a resist film caused in case of abrupt acceleration at the time of discharging the resist solution 36 can be reduced by changing the rotating speed in two stages in this manner.

The rotatable table 21 is kept turning at least until the ethyl lactate solvent 35 is removed through volatilization. When the spin motor 23 is stopped to rotate about 20 seconds after starting the rotation, namely, after the ethyl lactate solvent 35 is removed through volatilization, a resist film (coated film) 36a having a specified film thickness is formed on the surface of the wafer 20, as shown in FIG. 4C.

(A) First example

In a first example, three kinds of photoresist films are formed as using a solvent spreading period (t3) after dripping the solvent as a parameter. In order to examine variation in thickness of the photoresist films in relation to the solvent spreading period (t3) after dripping the solvent, the period (t3) is changed in such three stages as t3=0,4, and 5 seconds, where a condition of t3=0 shows that the process goes to the dripping period (t5) immediately after the solvent prespinning period (t2) without passing through the solvent spreading period (t3).

Figure 6A:
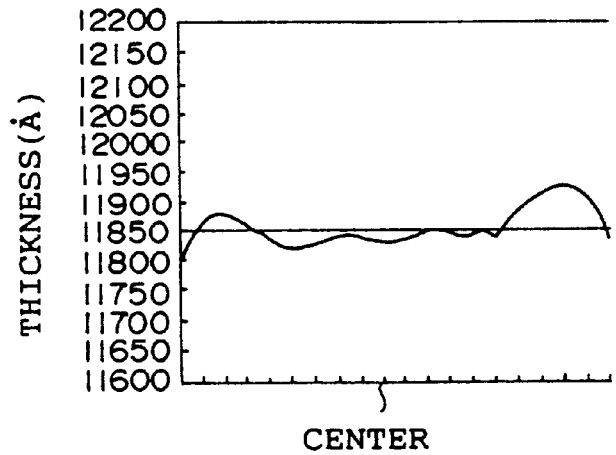
FIGS. 6A, 6B and 6C are diagrams showing an on-the-surface distribution of thickness of a photoresist film formed on a wafer by a static-dripping method for spin coating by means of an apparatus for spin coating of an embodiment of the invention.
Figure 6B:
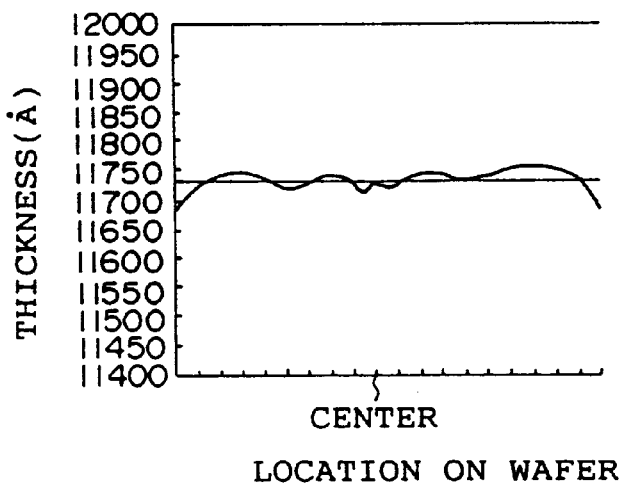
Figure 6C:
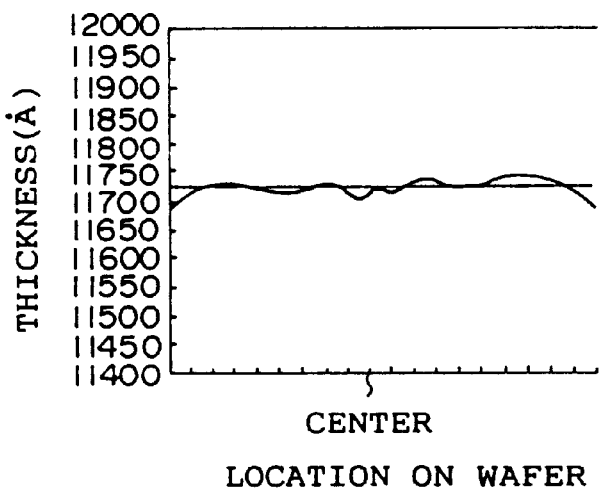

Each of FIGS. 6A to 6C shows an on-the-surface distribution of thickness of each of three kinds of photoresist films formed on the wafer 20 by means of the above-mentioned spin coating method. FIGS. 6A, 6B, and 6C show, respectively, the cases of t3=0 second, t3=4 seconds, and t3=5 seconds. In each of these cases, the axis of ordinates shows thickness (Å) of a film and the axis of abscissas shows location in the wafer.

In the embodiment, the following data were obtained.
1) In case of t3=0 second, Average film thickness=11850 Å
   σ=114 Å
2) In case of t3=4 seconds, Average film thickness=11740 Å
   σ=76 Å
3) In case of t3=5 seconds, Average film thickness=11725 Å
   σ=59 Å

Figure 2A:
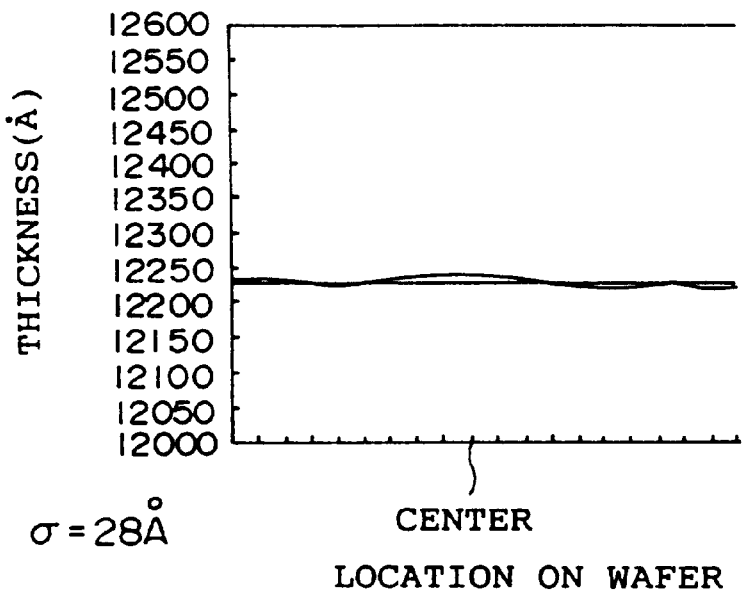
FIGS. 2A and 2B are diagrams showing an on-the-surface distribution of thickness of a photoresist film formed on a wafer by means of an apparatus for spin coating and a dynamic-dripping method for spin coating according to the prior art.
Figure 2B:
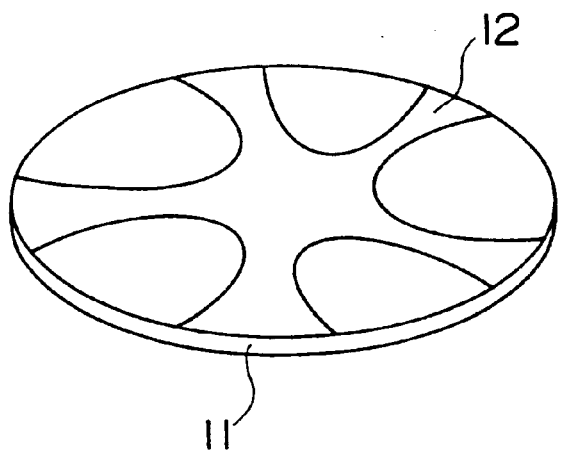

According to the above-mentioned result, as the solvent spreading period (t3) becomes longer, a resist film becomes thinner in thickness and less in variation in thickness. However, when the period becomes longer than t3=5 seconds, on the contrary the variation is increased since thickness of the resist film 36a becomes thinner in the fringe part of the wafer 20 while it becomes thicker in the center part of it. An extreme case is similar to a prior example shown in FIG. 2B.

Figure 1A:
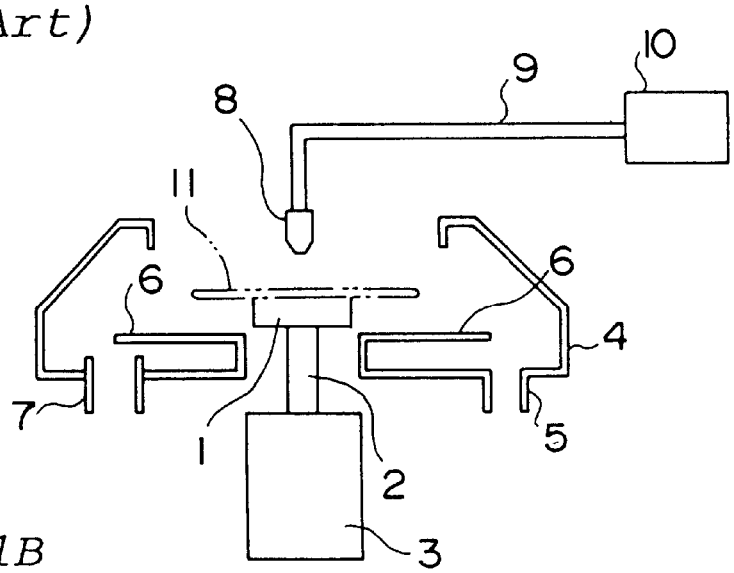
FIGS. 1A and 1B are schematic diagrams of an apparatus for spin coating and a dynamic-dripping method for spin coating according to the prior art.
Figure 1B:
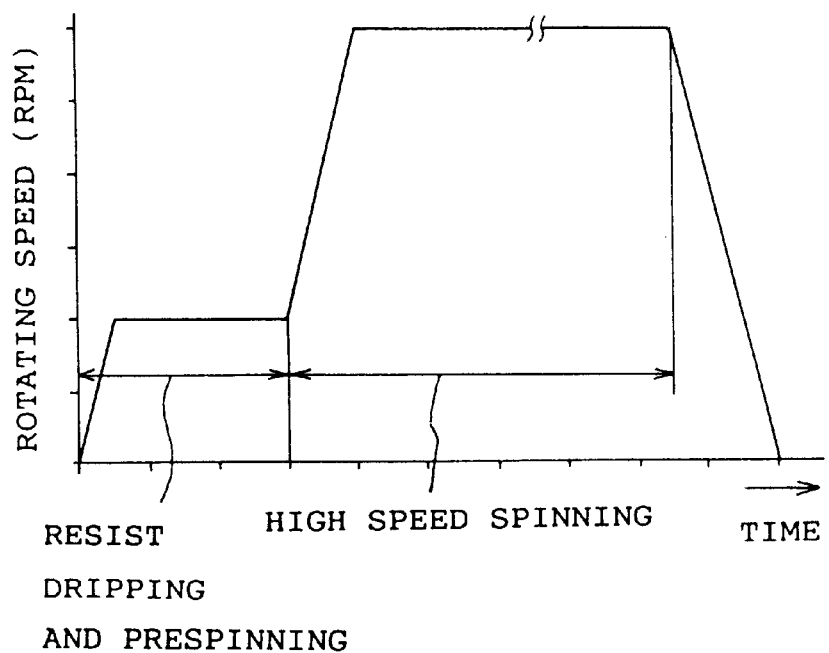
Figure 7A:
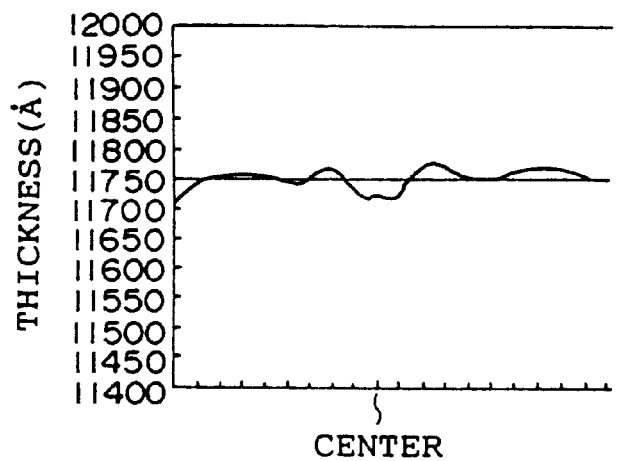
FIGS. 7A, 7B and 7C are diagrams showing an on-the-surface distribution of thickness of a photoresist film formed on a wafer by a static-dripping method for spin coating by means of an apparatus for spin coating of an embodiment of the invention.
Figure 7B:
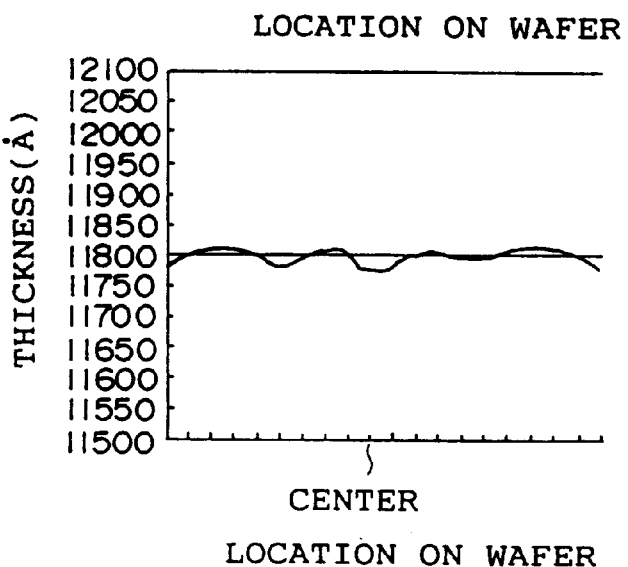
Figure 7C:
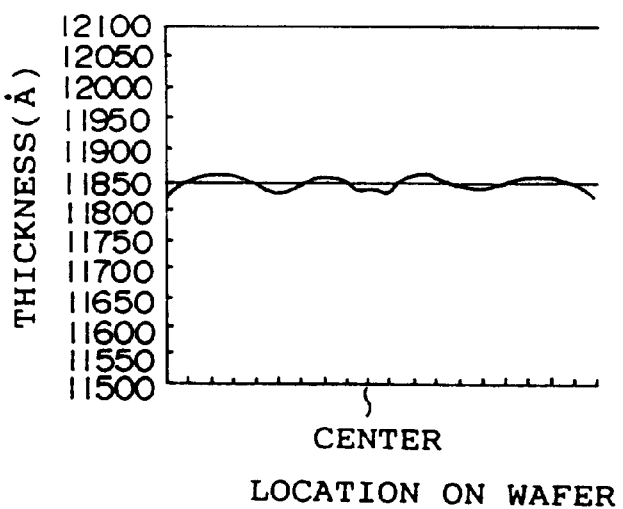

Although data shown in FIGS. 7A to 7C are greater in variation in comparison with data shown in FIG. 1A, such variations are at a level which is actually no problem, since they are nearly within ±50 Å.

From the above, it is found that a proper length of the solvent spreading period is 4 to 5 seconds. The reason is thought that a proper amount of solvent was remained over a proper range from a proper location on the fringe part of the wafer.

As described above, a method for spin coating according to the embodiment of the invention could greatly reduce variations in thickness with an amount of resist solution of only 0.5 cc in comparison with the prior art.

Further, a spin coating method according to the embodiment of the invention could reduce into 0.5 cc an amount of resist solution of about 3 cc required in a method of the prior art in order to obtain a resist film which is the same and uniform in thickness.

The reason is thought that since the fringe part of the wafer 20 is covered with an ethyl lactate solvent 35, when the resist solution 36 coated on the center part of the surface of the wafer 20 is spread around by the centrifugal force made by rotation to reach the fringe part covered with the ethyl lactate solvent 35, the resist solution 36 is diluted with a proper amount of ethyl lactate solvent and therefore it is uniformly spread over the fringe part of the surface of wafer 20 and the resist solution 36 is effectively used.

In this manner, since a sufficient amount of resist solution is uniformly supplied to the fringe part of the wafer 20 even in case that the ethyl lactate solvent is easy to dry and an amount of discharged resist solution is a little, a resist film with both specified and uniform thickness can be formed on the wafer 20.

Furthermore, by inputting in advance into the control means 33 such information as a kind and viscosity of each of the resist solution and solvent, an evaporating rate of the solvent, the diameter of a wafer 20, an ambient temperature around the rotatable table 21, and the like, the apparatus can automatically set conditions for forming a coated film of both specified and uniform thickness with the least amount of coating solution and can also automatically operate the rotating means 23, the discharge mechanism parts 31a and 31b, and the moving means 32.

In the embodiment of the invention, ethyl lactate is used as a solvent, but another solvent, for example, Ethyl Cellosolve Acetate (ECA) also can be used.

Though a resist solution 36 is used as a coating solution, an SOG solution or a polyimide solution also can be used.

In such cases, silanol, methanol, Methyl Cellosolve, and the like can be used as a solvent for the SOG solution. And NMP (N-methyl-2-pyrrolidone) and the like can be used as a solvent for the polyimide solution.

Figure 8:
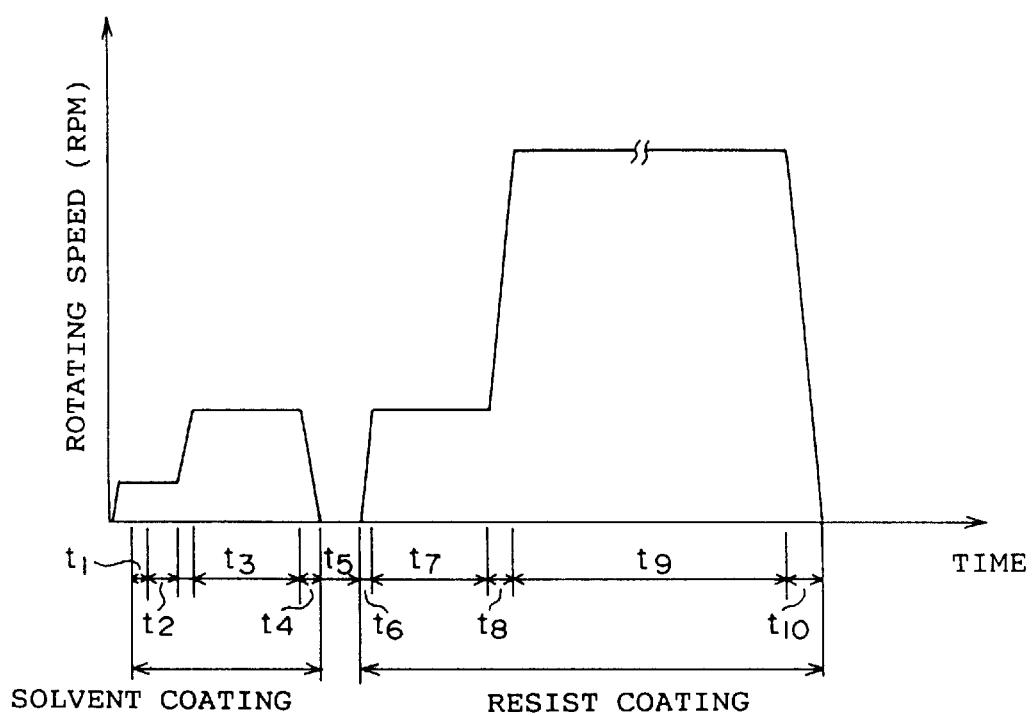
FIG. 8 is a timing chart for explaining a dynamic-dripping method for spin coating by means of an apparatus for spin coating of an embodiment of the invention.

Furthermore, though a static-dripping method for spin coating is used for coating a resist solution in the embodiment, a dynamic-dripping method for spin coating which coats a resist solution in a period of accelerating the spin motor can be also used as shown in FIG. 8. And in FIG. 8, the process may proceed to the resist dripping period (t6) immediately after the solvent spreading period (t3), without passing through the rest period (t5).

In the above-mentioned embodiment, the resist solution is dripped in the center part of the wafer and the solvent is dripped in the fringe part of the wafer, but application of the invention is not limited to these positions.

(B) Second example

In a second example, three kinds of photoresist films are formed as using an ambient temperature around the rotatable table as a parameter.

FIGS. 7A to 7C show thickness of photoresist films and variations in thickness of the resist films which were formed using the same method as mentioned above, as changing an ambient temperature (T) around the rotatable table in three stages of 21° C., 23° C., and 25° C. and setting a solvent spreading period (t3) as 4 seconds.

FIGS. 7A, 7B, and 7C show, respectively, the cases of T=21° C., T=23° C., and T=25° C. In each of these cases, the axis of ordinates shows thickness (Å) of a film and the axis of abscissas shows location on the wafer.

In the embodiment, the following data were obtained.
1) In case of T=21° C., Average film thickness=11750 Å
   σ=62 Å
2) In case of T=23° C., Average film thickness=11800 Å
   σ=44 Å
3) In case of T=25° C., Average film thickness=11850 Å
   σ=39 Å

According to the above-mentioned result, as the ambient temperature (T) around the rotatable table becomes higher, a photoresist film becomes thicker in thickness and less in variation in thickness. The reason is thought that an ethyl lactate solvent became lower in viscosity and easier to flow as the ambient temperature (T) became higher.

Since FIGS. 6B and 7B have the same conditions, they should show the same results, but they are different in thickness of the films and also in variations in thickness of them. The reason is thought that this difference was caused by variation of the air current inside the process cup 24 which is difficult to estimate.

In the above-mentioned embodiment, a static-dripping method for spin coating is used, but application of the invention is not limited to this.

(C) Third example

Figure 9A:
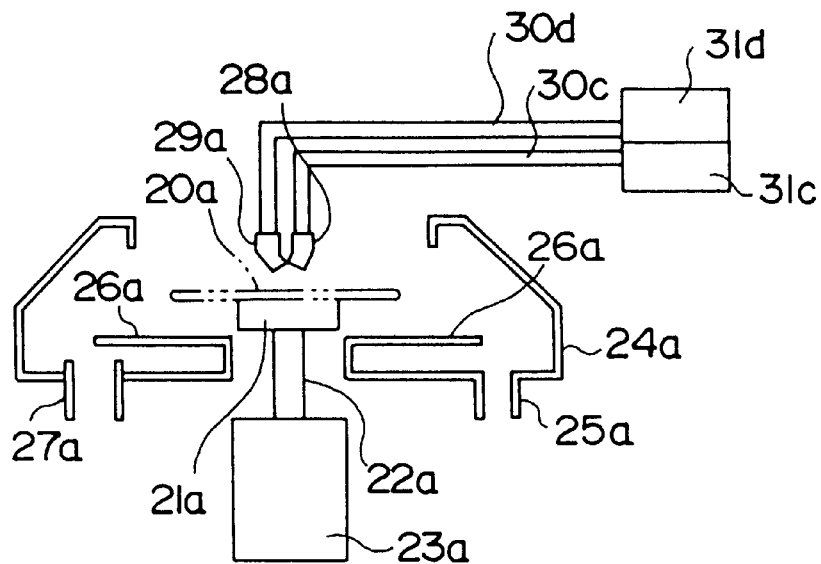
FIGS. 9A and 9B are schematic diagrams showing an apparatus for spin coating and a dynamic-dripping method for spin coating according to another embodiment of the invention.

FIG. 9A is a side view showing a schematic structure of a spin coating apparatus according to a third embodiment of the invention. What distinguishes this apparatus from the spin coating apparatus according to the first example shown in FIG. 3 is the fact that both of a resist solution discharging means 28a and a solvent discharging means 29a are disposed above the center part of the surface of a wafer 20a and fixed in the location, namely, a resist solution and a solvent are supplied from the same location. As for symbols in FIG. 9A, a symbol having the same number as FIG. 3 shows a part equivalent to that in FIG. 3.

Figure 9B:
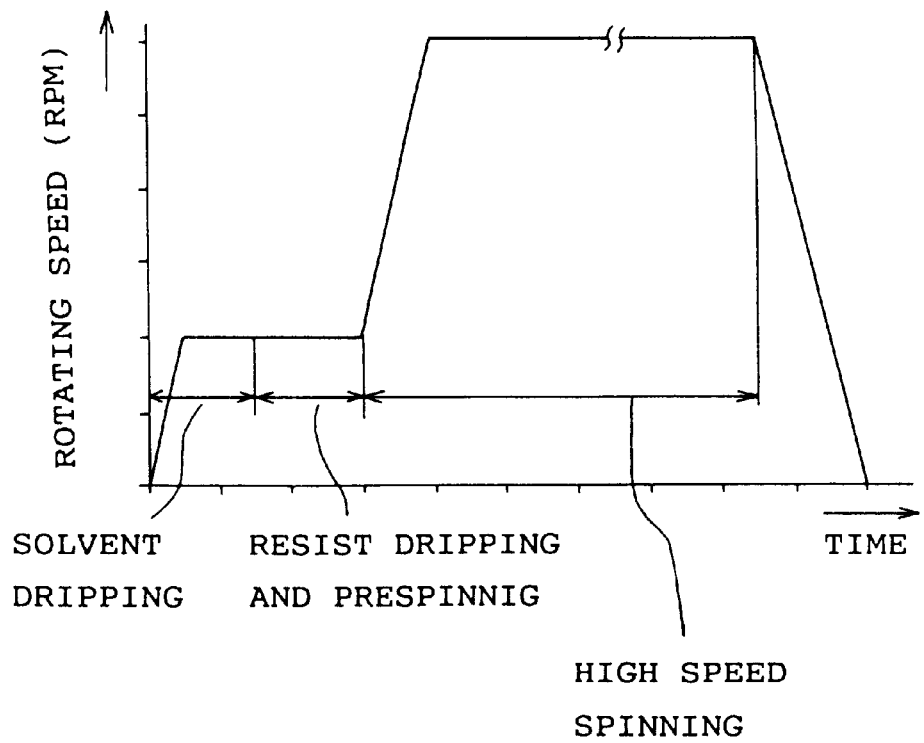

FIG. 9B is a timing chart showing a process sequence by a method for spin coating which uses the spin coating apparatus according to the third example.

Resist films were formed on the wafer 20a by means of the spin coating apparatus shown in FIG. 9A and according to the timing chart in FIG. 9B.

First, the wafer 20a is fixed on the rotatable table 21a by suction and the air current inside the process cup 24a is adjusted.

Next, the wafer 20a is turned by rotating the spin motor 23a at a low rotating speed of 1500 rpm. Then after discharging by about 10 cc the same kind of ethyl lactate solvent as an volatile ethyl lactate solvent contained in a resist solution to be coated on the wafer 20a through the solvent discharge nozzle 29a, the rotatable table 21a is turned by rotating the spin motor 23a at a low rotating speed of 1500 rpm. Thus the ethyl lactate solvent is spread by the centrifugal force from the center part to the fringe part all over the wafer 20a.

Next, the resist solution of about 0.5 cc is discharged on the center part of the wafer 20a before the ethyl lactate solvent is spread thoroughly over the surface of the wafer 20a and is removed through volatilization, namely, about 3 seconds after starting rotation of the spin motor 23a. The discharged resist solution is immediately spread by the centrifugal force from the center part to the fringe part all over the wafer 20a.

Next, about 3 seconds after discharging the resist solution, a rotating speed of the spin motor 23a is increased to 3000 rpm. Thus, as the ethyl lactate solvent contained in the resist solution is evaporated while the resist solution is spread more and the resist film is made thinner by the greater centrifugal force, the resist film is gradually formed. In this case, variation in thickness of the resist film caused in case of abrupt acceleration at the time of discharging the resist solution is reduced by changing the rotating speed in two stages.

And the rotatable table 21a is kept turning at least until the ethyl lactate solvent is removed by volatilization. When the spin motor 23a is stopped to rotate about 11 seconds after the rotating speed is raised, namely, at least after the ethyl lactate solvent is removed by volatilization, a resist film (coated film) of specified thickness has been formed on the wafer 20a.

Figure 10:
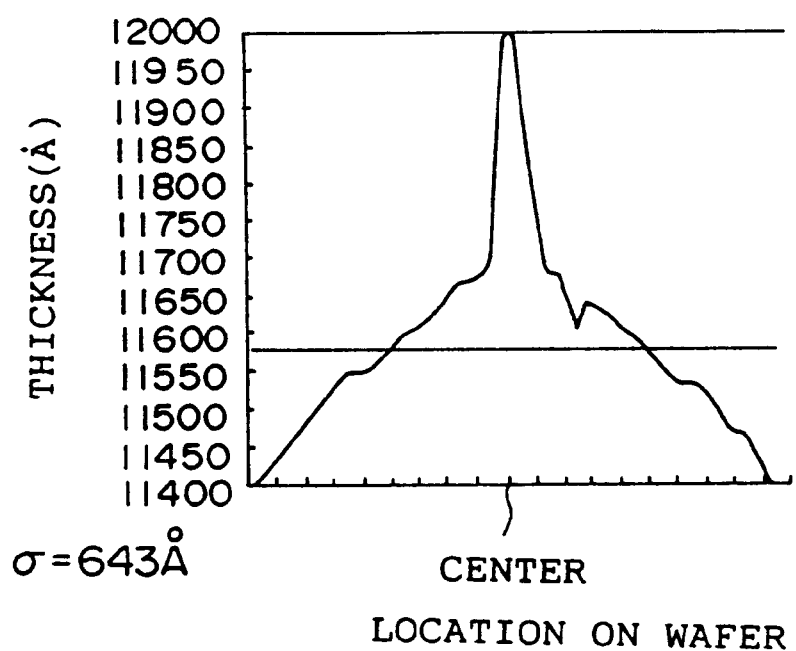
FIG. 10 is a diagram showing an on-the-surface distribution of thickness of a resist film formed on a wafer by a dynamic-dripping method for spin coating by means of an apparatus for spin coating of another embodiment of the invention.

FIG. 10 shows an on-the-surface distribution of thickness of a resist film formed on the wafer 20a by means of the above-mentioned spin coating method. The axis of ordinates shows thickness (A) of a film and the axis of abscissas shows location in the wafer. In FIG. 10, the resist film is thicker in the center part and thinner in the fringe part of the wafer.

In this case, the following data were obtained.

Average film thickness=11580 Å

σ=643 Å

In this manner, the third example showed fairly greater variation in film thickness in comparison with methods for spin coating in the first and second examples. The reason is thought that since the resist solution and the solvent are not mixed well with each other on the center part of the wafer 20a, the resist solution great in viscosity is left without spreading.

However, since the solvent was coated on the surface of the wafer 20a before applying the resist solution, the resist solution became easier to flow and so the resist solution could be spread enough to the fringe part by rotating the wafer 20 at a high speed. As a result, consumption of the resist was reduced by half.

What is claimed is:

1. A method for spin coating comprising:

discharging a solvent from a discharge nozzle directly onto a peripheral portion of one surface of a wafer having a periphery;

spinning the wafer at a first speed to spread the solvent radially outwardly toward the periphery of the surface of the wafer;

discharging a coating solution onto said one surface of the wafer nearer a center part than the peripheral portion;

spinning the wafer at a second speed to spread the coating solution radially outwardly over the entirety of the surface of the wafer, the coating solution being diluted with the solvent when the coating solution reaches the peripheral portion of the surface of the wafer so as to produce a resist film having almost the same thickness over the entire one surface of the wafer.

2. A method for spin coating according to claim 1, wherein the coating solution is discharged on the center part of the surface of the wafer.

3. A method or spin coating according to claim 1, wherein the coating solution is a resist solution.

4. A method for spin coating according to claim 1, wherein the coating solution is one of a spin-on-glass solution and a polyimide solution.

5. A method for spin coating according to claim 1, wherein the second speed is faster than the first speed.

* * * * *